(12) United States Patent
Delmas et al.

(10) Patent No.: US 10,636,677 B2
(45) Date of Patent: Apr. 28, 2020

(54) HIGH PRESSURE AND HIGH TEMPERATURE ANNEAL CHAMBER

(71) Applicant: Applied Materials, Inc., Santa Clara, CA (US)

(72) Inventors: Jean Delmas, Santa Clara, CA (US); Steven Verhaverbeke, San Francisco, CA (US); Kurtis Leschkies, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/046,119

(22) Filed: Jul. 26, 2018

(65) Prior Publication Data

US 2019/0057879 A1 Feb. 21, 2019

Related U.S. Application Data

(60) Provisional application No. 62/547,742, filed on Aug. 18, 2017.

(51) Int. Cl.
*H01L 21/324* (2006.01)
*H01L 21/67* (2006.01)

(52) U.S. Cl.
CPC ...... *H01L 21/324* (2013.01); *H01L 21/67017* (2013.01); *H01L 21/67109* (2013.01)

(58) Field of Classification Search
CPC ............. H01L 21/324; H01L 21/67017; H01L 21/67109
See application file for complete search history.

(56) References Cited

U.S. PATENT DOCUMENTS 4,524,587 A  6/1985  Kantor
4,879,259 A * 11/1989  Reynolds ............ H01L 21/3245
                                                            438/796

(Continued)

FOREIGN PATENT DOCUMENTS

CN   101871043 A   10/2010
CN   104047676 A   9/2014

(Continued)

OTHER PUBLICATIONS

Taiwan Office Action dated Jun. 11, 2019 for Application No. 107138905.

(Continued)

*Primary Examiner* — Victor A Mandala
(74) *Attorney, Agent, or Firm* — Patterson & Sheridan, LLP

(57) ABSTRACT

Embodiments of the disclosure relate to an apparatus and method for annealing semiconductor substrates. In one embodiment, a batch processing chamber is disclosed. The batch processing chamber includes a chamber body enclosing a processing region, a gas panel configured to provide a processing fluid into the processing region, a condenser fluidly connected to the processing region and a temperature-controlled fluid circuit configured to maintain the processing fluid at a temperature above a condensation point of the processing fluid. The processing region is configured to retain a plurality of substrates during processing. The condenser is configured to condense the processing fluid into a liquid phase.

5 Claims, 4 Drawing Sheets

(56) References Cited

U.S. PATENT DOCUMENTS

| | | |
|---|---|---|
| 5,050,540 A | 9/1991 | Lindberg |
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 10,096,516 B1 * | 10/2018 | Leschkies .......... H01L 21/67109 |
| 10,276,411 B2 * | 4/2019 | Delmas .......... H01L 21/67109 |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 * | 10/2012 | Tohnoe .......... H01L 21/28556 438/658 |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |

(56) References Cited

U.S. PATENT DOCUMENTS

| | | |
|---|---|---|
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0350563 A1* | 12/2018 | Manna .............. H01L 21/02326 |
| 2019/0259625 A1 | 8/2019 | Nemani et al. |

FOREIGN PATENT DOCUMENTS

| | | |
|---|---|---|
| CN | 104089491 A | 10/2014 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

Shimoyama, Takehiro et al., "Porous Aluminum for Heat Exchanger", Hitachi Chemical, pp. 19-20.

Kato, T. et al., "Heat Transfer Characteristics of a Plate-Fin Type Supercritical/Liquid Helium Heat Exchanger", ICEC 14 Proceedings Supplement, 1992, pp. 260-263.

Lee, Ho-Saeng et al., "The cooling heat transfer characteristics of the supercritical CO2 in mico-fin tube", Springer, Oct. 2, 2012, pp. 173-184.

International Search Report and Written Opinion dated Nov. 30, 2018 for Application No. PCT/US2018/041688.

International Search Report and Written Opinion from PCT/US2018/034036 dated Aug. 24, 2018.

International Search Report and Written Opinion dated Aug. 24, 2018 for Application No. PCT/US2018/034284.

International Search Report, Application No. PCT/US2018/028258 dated Aug. 9, 2018.

International Search Report and Written Opinion for PCT/US2018/035210 dated Aug. 24, 2018.

International Search Report and Written Opinion for International Application No. PCT/US2019/029602 dated Aug. 14, 2019.

International Search Report and Written Opinion from PCT/US2019/012161 dated Apr. 30, 2019.

International Search Report and Written Opinion for PCT/US2019/014759 dated May 14, 2019.

International Search Report and Written Opinion for PCT/US2019/015332 dated May 15, 2019.

International Search Report and Written Opinion for PCT/US2018/059676 dated May 23, 2019.

International Search Report and Written Opinion for PCT/US2019/023431 dated Jul. 5, 2019.

Haskel Pressure on Demand, Pneumatic and Hydraulic Driven Gas Boosters, Apr. 30, 2016, 36 pp.

Taiwan Office Action dated Jul. 3, 2019 for Application No. 107136181.

Office Action for Japanese Application No. 2018-546484 dated Oct. 8, 2019.

International Search Report and Written Opinion for International Application No. PCT/US2019/040195 dated Oct. 25, 2019.

International Search Report and Written Opinion for PCT/US2018/059643 dated Feb. 26, 2019.

International Search Report and Written Opinion for PCT/US2018/043160 dated Jan. 31, 2019.

International Search Report and Written Opinion for PCT/US2018/037539 dated Oct. 5, 2018.

International Search Report and Written Opinion for PCT/US2018/038822 dated Oct. 26, 2018.

International Search Report and Written Opinion for PCT/US2018/021715 dated Jun. 22, 2018.

International Search Report and Written Opinion dated Jan. 31, 2019 for Application No. PCT/US2018/042760.

Taiwan Office Action dated Nov. 19, 2019 for Application No. 108103415.

Office Action for Japanese Application No. 2018-517285 dated Oct. 23, 2019.

Office Action for Taiwan Patent Application No. 108111501 dated Nov. 14, 2019.

* cited by examiner

HIGH PRESSURE AND HIGH TEMPERATURE ANNEAL CHAMBER

CROSS-REFERENCE TO RELATED APPLICATIONS

This application claims the benefit of U.S. Provisional Application Ser. No. 62/547,742, filed Aug. 18, 2017, which is incorporated by reference in its entirety.

BACKGROUND

Field

Embodiments of the disclosure generally relate to fabrication of integrated circuits and particularly to an apparatus and method for annealing one or more semiconductor substrates.

Description of the Related Art

Formation of a semiconductor device, such as memory devices, logic devices, microprocessors etc. involves deposition of one or more films over a semiconductor substrate. The films are used to create the circuitry required to manufacture the semiconductor device. Annealing is a heat treatment process used to achieve various effects on the deposited films to improve their electrical properties. For example, annealing can be used to activate dopants, densify the deposited films, or change states of grown films.

Semiconductor device geometries have dramatically decreased in size since their introduction several decades ago. Increasing device densities have resulted in structural features having decreased spatial dimensions. For example, the aspect ratio (ratio of depth to width) of gaps and trenches forming the structural features of modern semiconductor devices have narrowed to a point where filling the gap with material has become extremely challenging.

Thus, there is a need for an improved apparatus and method for annealing semiconductor substrates that can accommodate the challenges associated with manufacturing modern semiconductor devices.

SUMMARY

Embodiments of the disclosure relate to an apparatus and method for annealing one or more semiconductor substrates. In one embodiment, a batch processing chamber is disclosed. The batch processing chamber includes a chamber body enclosing a processing region, a gas panel configured to provide a processing fluid into the processing region, a condenser fluidly connected to the processing region and a temperature-controlled fluid circuit configured to maintain the processing fluid at a temperature above a condensation point of the processing fluid. The processing region is configured to accommodate a plurality of substrates during processing. The condenser is configured to condense the processing fluid into a liquid phase.

In yet another embodiment of the disclosure, a method of annealing substrates is disclosed. The method includes loading substrates into a processing region of a processing chamber, flowing a processing fluid through a gas conduit into the processing region and maintaining the processing fluid in the gas conduit and the processing region at a temperature above a condensation point of the processing fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure relate to an apparatus and method for annealing one or more semiconductor substrates. The substrates may be annealed as a single substrate or in batches inside a single chamber. The substrates are exposed to a processing fluid under high pressure at a high temperature during annealing. The processing fluid is flowed from a gas panel through a temperature-controlled fluid circuit into a chamber when the one or more substrates are processed. The processing fluid is maintained at a temperature above the condensation point of the processing fluid by one or more heaters coupled to the fluid circuit. The fluid circuit is coupled to a condenser, where the processing fluid is condensed into liquid phase after annealing is complete. The heaters on the fluid circuit are controlled using information from temperature measurements obtained through temperature sensors interfaced with different portions of the fluid circuit. A batch processing chamber 100 shown in FIG. 1 and described herein, as well as a single-substrate processing chamber 200 shown in FIG. 2 and described herein, can be utilized for the purpose of performing the high-pressure annealing process at high temperatures.

Figure 1:
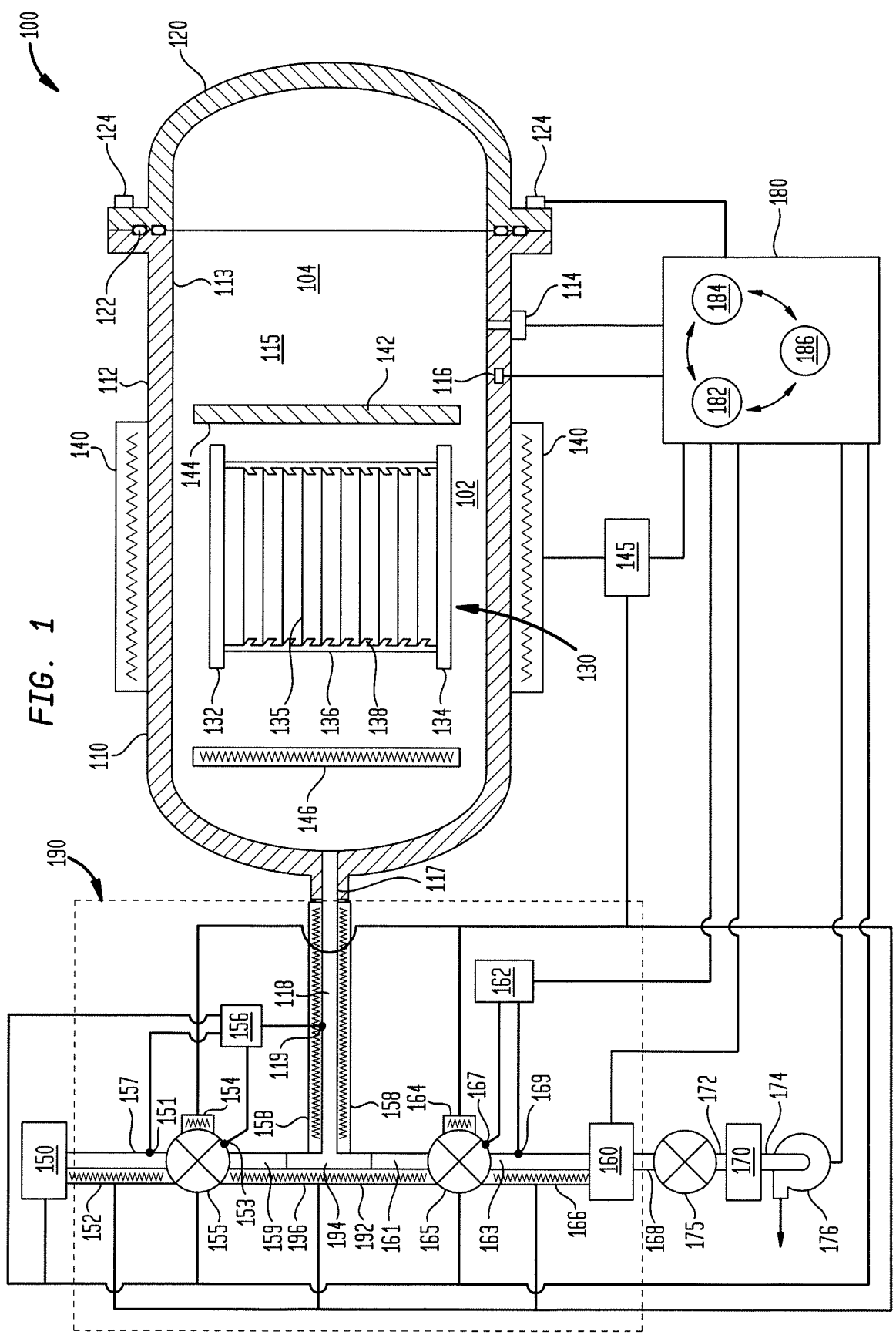
FIG. 1 is a simplified front cross-sectional view of a batch processing chamber for annealing one or more substrates.

FIG. 1 is simplified front cross-sectional view of a batch processing chamber 100 for a high-pressure annealing process at a high temperature. The batch processing chamber 100 has a body 110 with an outer surface 112 and an inner surface 113 that encloses an internal volume 115. In some embodiments such as in FIG. 1, the body 110 has an annular cross section, though in other embodiments the cross-section of the body 110 may be rectangular or any closed shape. The outer surface 112 of the body 110 may be made from a corrosion resistant steel (CRS), such as but not limited to stainless steel. The outer surface 112 may be optionally covered with a layer of thermal insulation that prevents loss of heat from the batch processing chamber 100 into the outside environment. The inner surface 113 of the body 110 may be made from or covered with nickel-based steel alloys that exhibit high resistance to corrosion, such as but not limited to HASTELLOY®, ICONEL®, and MONEL®. Optionally, the body 110 may be fabricated from a nickel-based steel alloy.

The batch processing chamber 100 has a door 120 configured to sealably enclose the internal volume 115 within the body 110 such that substrates may be transferred in and out of the internal volume 115 when the door 120 is open. A high-pressure seal 122 is utilized to seal the door 120 to the body 110 during processing. The high-pressure seal 122 may be made from a high-temperature polymer, such as but not limited to a perflouroelastomer. A cooling channel 124 is disposed in the door 120 or the body 110 adjacent to the high-pressure seals 122 in order to maintain the high-pressure seals 122 below the maximum safe-operating temperature of the high-pressure seals 122. A cooling agent, such as but not limited to an inert, dielectric, and high-performance heat transfer fluid, may be circulated within the cooling channel 124. The flow of the cooling agent within the cooling channel 124 is controlled by a controller 180 through feedback received from a temperature sensor 116 or a flow sensor (not shown).

An anti-convection panel 142 may be placed between the door 120 and the cassette 130. The anti-convection panel 142 separates the internal volume 115 into a hot processing region 102 in which the cassette 130 resides and a cooler region 104 proximate the door 120. The anti-convection panel 142 is generally a metal plate fabricated from the same materials as the chamber body 110. The anti-convection panel 142 may be coupled to the door 120, the cassette 130 or other suitable structure. The anti-convection panel 142 may include a face 144 facing the cassette 130 that is configured to reduce the amount of heat transfer from the region in which the cassette 130 resides to the region of the body 110 proximate the door 120. The face 144 may be large enough to inhibit convection between the hot processing and cooler regions 102, 104. The face 144 may also have a polished surface or heat reflecting coating. The anti-convection panel 142 causes portions of the chamber body 110 bounding the cooler region 104 to be shielded from and maintained at temperature less than the portions of the chamber body 110 bounding the hot processing region 102. Thus, seals 122 proximate the door 120 and contacting the portions of the chamber body 110 bounding the cooler region 104 are less likely to fail due to exceeding their maximum operational temperatures.

The batch processing chamber 100 has a port 117 formed through the body 110. The port 117 is fluidly connected to a temperature-controlled fluid circuit 190. The fluid circuit 190 connects a gas panel 150, a condenser 160 and the port 117. The fluid circuit 190 has a gas conduit 192, a source conduit 157, an inlet isolation valve 155, an exhaust conduit 163, and an outlet isolation valve 165. One or more heaters 152, 154, 158, 196, 164, 166 are interfaced with different portions of the fluid circuit 190. One or more temperature sensors 151, 153, 119, 167 and 169 are interfaced with different portions of the fluid circuit 190 to obtain temperature measurements and provide the temperature measurement information to the controller 180.

The gas conduit 192 is fluidly connected to the internal volume 115 through the port 117 at one end. The gas conduit 192 has four portions that include a chamber conduit 118, a T-conduit 194, an inlet conduit 159 and an outlet conduit 161. The T-conduit 194 has three ends: a first end connected to the inlet conduit 159, a second end connected to the outlet conduit 161 and a third end connected to the chamber conduit 118. The chamber conduit 118 is fluidly connected to the internal volume 115 via the port 117. The inlet conduit 159 is fluidly connected to the source conduit 157 via the inlet isolation valve 155. The outlet conduit 161 is fluidly connected to the exhaust conduit 163 via the outlet isolation valve 165. The source conduit 157 is fluidly coupled to the gas panel 150. The exhaust conduit 163 is fluidly coupled to the condenser 160.

The chamber conduit 118 is interfaced with the heater 158. The T-conduit 194, the inlet conduit 159 and the outlet conduit 161 are interfaced with the heater 196. The source conduit 157 is interfaced with the heater 152. The inlet isolation valve 155 is interfaced with the heater 154. The outlet isolation valve 165 is interfaced with the heater 164. The exhaust conduit 163 is interfaced with the heater 166. The heaters 152, 154, 158, 196, 164, and 166 are configured to maintain a processing fluid flowing through the fluid circuit 190 at a temperature above the condensation point of the processing fluid. For example, the heaters 152, 154, 158, 196, 164, and 166 may be configured to maintain a processing fluid flowing through the fluid circuit 190 at a temperature which maintains the processing fluid as dry steam or superheated steam. The heaters 152, 154, 158, 196, 164, and 166 may be optionally covered with a layer of thermal insulation to prevent loss of heat into the outside environment. The heaters 152, 154, 158, 196, 164, and 166 may be lamps, resistive heating elements, fluid conduits for flowing a transfer fluid or other suitable heating devices. In one embodiment, the heaters are resistive strips wound around the elements of the fluid circuit. The heaters 152, 154, 158, 196, 164, and 166 are individually coupled to a power source 145. In one embodiment, each of the heaters 152, 154, 158, 196, 164, and 166 may be independently controlled.

The temperature sensor 151 is interfaced with the source conduit 157 and configured to measure the temperature of the source conduit 157. The temperature sensor 153 is interfaced with the inlet isolation valve 155 and configured to measure the temperature of the inlet isolation valve 155. The temperature sensor 119 is interfaced with the chamber conduit 118 and configured to measure the temperature of the chamber conduit 118. A temperature reading device 156 receives and displays the temperature measurements from the temperature sensors 151, 153 and 119. The temperature sensor 167 is interfaced with the outlet isolation valve 165 and configured to measure the temperature of the outlet isolation valve 165. The temperature sensor 169 is interfaced with the exhaust conduit 163 and configured to measure the temperature of the exhaust conduit 163. A temperature reading device 162 receives and displays the temperature measurements from the temperature sensors 167 and 169. The temperature reading devices 156 and 162 send the temperature measurement information to the controller 180. The sensors 151, 153, 119, 167 and 169 may be a non-contact sensor, such as an infra-red sensor, or a contact sensor, such as a thermocouple.

The inlet isolation valve 155 and the outlet isolation valve 165 are shutoff valves. When the inlet isolation valve 155 is open, the outlet isolation valve 165 is closed such that a processing fluid flowing through source conduit 157 enters into the gas conduit 192 and the internal volume 115, preventing the flow of the processing fluid into the condenser 160. On the other hand, when the outlet isolation valve 165 is open, the inlet isolation valve 155 is closed such that a gaseous product is removed from the internal volume 115 and flows through the exhaust conduit 163 and into the condenser 160, preventing the flow of the gaseous product into the gas panel 150.

Figure 3:
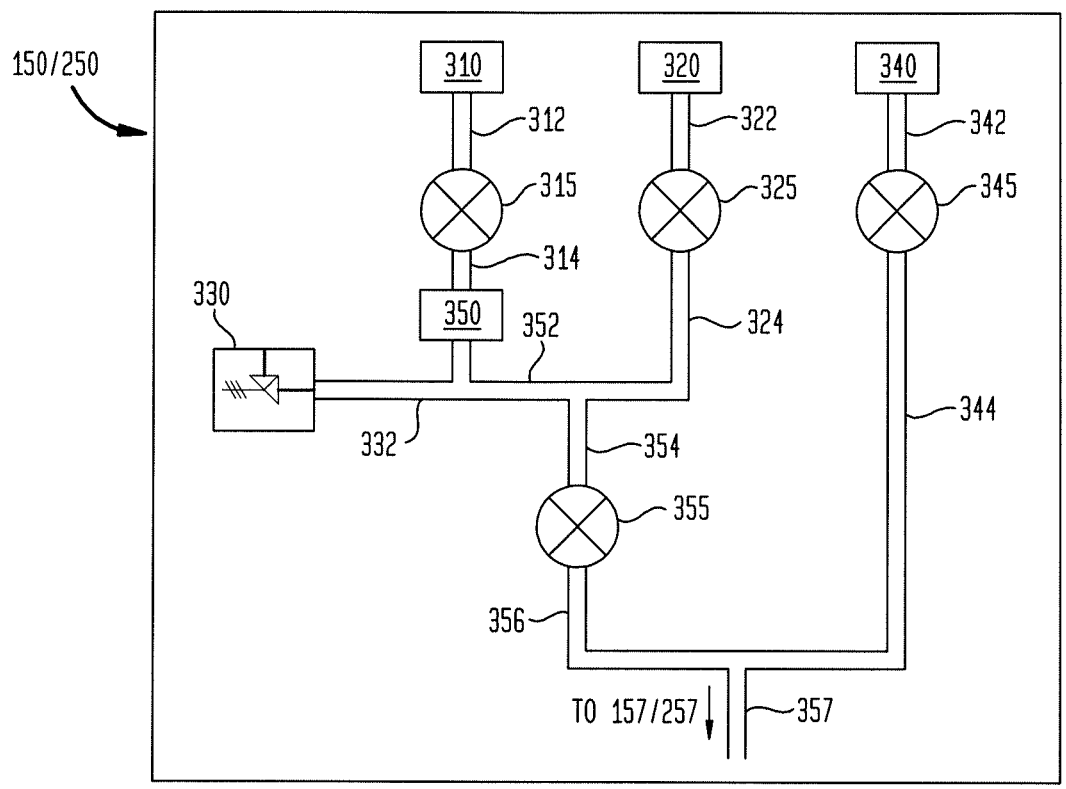
FIG. 3 is a simplified schematic of a gas panel used in the batch processing chamber and the single-substrate chamber.

The gas panel 150 is configured to provide a processing fluid under pressure into the source conduit 157 for transmission into the internal volume 115 through the gas conduit 192. As shown in FIG. 3, the gas panel 150 includes a processing fluid inlet 310, an optional inert gas inlet 320, a purge gas inlet 340 and a common outlet conduit 357. The processing fluid inlet 310 is fluidly connected to a fluid source (not shown). The fluid source may provide water or other suitable fluid that is heated to a gas phase and utilized as the processing fluid. The processing fluid inlet 310 is fluidly connected to a vaporizer 350 by conduits 312, 314, and an isolation valve 315. The isolation valve 315 has a first (i.e., closed) state that prevent flow from the fluid source from entering the vaporizer 350. The isolation valve 315 has a second (i.e., open) state that allows flow from the fluid source to enter the vaporizer 350. The isolation valve 315 is also be configured or utilized with a mass flow meter to regulate the amount of processing fluid flowing into the vaporizer 350. The vaporizer 350 is configured to convert the processing fluid into a gas phase. In one example, the vaporizer 350 converts water into steam. In one example, the vaporizer 350 converts water into dry steam or superheated steam.

The vaporizer 350 is fluidly connected to a common inlet conduit 354 by a conduit 352. The vaporizer 350 and the common inlet conduit 354 are also fluidly connected to a pressure safety valve 330 by a conduit 332. The pressure safety valve 330 is configured to release excess pressure in the conduit 352 and is generally known in the art.

The optional inert gas inlet 320 is configured to provide a pressure control gas from a pressure control gas source (not shown) that is utilized to control the pressure of the processing fluid delivered through the common inlet conduit 354. The pressure control gas provided by the gas source may be a reactive gas or an inert gas, such as but not limited to nitrogen, argon, and the like, or other suitable gas(es). The inert gas inlet 320 is fluidly connected to the common inlet conduit 354 by an isolation valve 325 and conduits 322, 324. The isolation valve 325 has a first (i.e., closed) state that prevent flow from the pressure control gas source from entering the common inlet conduit 354 through the conduit 324. The isolation valve 325 has a second (i.e., open) state that allows flow from the pressure control gas source to enter the common inlet conduit 354 through the conduit 324. The isolation valve 325 is also be configured or utilized with a mass flow meter to regulate the amount of pressure control gas flowing into the common inlet conduit 354.

The common inlet conduit 354 is fluidly connected to the common outlet conduit 357 by a valve 355 and a conduit 356. The valve 355 may be configured as an isolation valve to selectively isolate the vaporizer 350 and the inert gas inlet 320 from the fluid circuit 190. The common outlet conduit 357 is fluidly connected to the source conduit 157 coupling the gas panel 150 to the inlet isolation valve 155. In another example, the valve 355 may be configured as a flow control valve to selectively control the amount of processing fluid the vaporizer 350 and the inert gas inlet 320 flowing from the fluid circuit 190 into the internal volume 155 of the chamber body 110. Example of flow control valves include needle valves, throttle valves, and modulating valves, among others.

A purge gas inlet 340 is also coupled to the source conduit 157 through the common outlet conduit 357. The purge gas inlet 340 is coupled to a source of purge gas (not shown). The purge gas may be an inert gas, such as but not limited to nitrogen, air, argon, and the like. The purge gas may be utilized to remove residuals of the processing fluid from the common outlet conduit 357 and the fluid circuit 190, when desired. The purge gas inlet 340 is fluidly connected to the common outlet conduit 357 by an isolation valve 345. The purge gas inlet 340 is fluidly connected to the isolation valve 345 by a conduit 342. The isolation valve 345 is configured to selectively isolate the purge gas inlet 340 from the common outlet conduit 357. The isolation valve 345 is fluidly connected to the common outlet conduit 357 by a conduit 344.

In some embodiments, the isolation valves 315, 325, 345 and 355 are shutoff valves. The operation of the isolation valves 315, 325, 345 and 355 are controlled by the controller 180. The pressure of the processing fluid introduced into the internal volume 115 is monitored by a pressure sensor 114 coupled to the body 110. As the fluid circuit 190 is continuously coupled to the internal volume 115, the pressure sensor 114 may also be utilized to determine the pressure within the fluid circuit 190. In embodiments where the fluid circuit 190 and the internal volume 115 have an isolation valve disposed therebetween or are configured such that a significant variation in pressure is expected, each of the fluid circuit 190 and the internal volume 115 may be equipped with separate pressure sensors 114.

The condenser 160 is fluidly coupled to a cooling fluid source (not shown) and configured to condense the gas phase processing fluid exiting the internal volume 115 through the gas conduit 192. The phase change in the condenser 160 pulls the processing fluid from the internal volume 115 and fluid circuit 190, which minimizes the need of purging gases. Optionally, condensed processing fluid exiting the condenser 160 may be routed through a heat exchanger 170 via an isolation valve 175. The heat exchanger 170 is configured to further cool the condensed processing fluid so that the processing fluid may be more easily managed. The condenser 160 is fluidly connected to the isolation valve 175 by a condenser conduit 168. The heat exchanger 170 is coupled to the isolation valve 175 by a heat exchanger conduit 172. A pump 176 is fluidly connected to the heat exchanger 170 by a pump conduit 174 and pumps out the liquefied processing fluid from the heat exchanger 170 to a container for recycling, reuse or disposal.

One or more heaters 140 are disposed on the body 110 and configured to heat the body 110 of the batch processing chamber 100. In some embodiments, the heaters 140 are disposed on an outer surface 112 of the body 110 as shown in FIG. 1. Each of the heaters 140 may be a resistive coil, a lamp, a ceramic heater, a graphite-based carbon fiber composite (CFC) heater, a stainless steel heater or an aluminum heater. The heaters 140 are powered by the power source 145. Power to the heaters 140 is controlled by the controller 180 through feedback received from a temperature sensor 116. The temperature sensor 116 is coupled to the body 110 and monitors the temperature of the body 110. In one example, the heaters 140 maintain the body 110 at a temperature above the condensation point of the processing fluid disposed in the internal volume 155.

One or more heaters 146 are disposed in the body 110 and configured to heat the substrates 135 disposed in the cassette 130 while in the internal volume 115 of the batch processing chamber 100. Each of the heaters 146 may be a resistive coil, a lamp, a ceramic heater, a graphite-based carbon fiber composite (CFC) heater, a stainless steel heater or an aluminum heater. In the embodiment depicted in FIG. 1, the heaters 146 are resistive heaters. The heaters 146 are powered by the power source 145. Power to the heaters 146 is controlled by the controller 180 through feedback received from a temperature sensor (not shown). The temperature sensor may be disposed in the body 110 and monitor the temperature of the internal volume 115. In one example, the heaters 146 are operable to maintain the substrates 135 disposed in the cassette 130 while in the hot processing region 102 of the internal volume 115 of the batch processing chamber 100 at a temperature above 300 degrees Celsius, such as between 300 and about 450 degrees Celsius, or even such as between 300 and about 500 degrees Celsius.

Since the heaters 146 generally maintain the hot processing region 102 of the internal volume 155 at a temperature significantly above the temperature of the fluid circuit 190, the dry steam exiting the fluid circuit 190 into the hot processing region 102 becomes superheated. The superheated dry steam advantageously will not condensate within the hot processing region 102, then preventing fluid from condensing on the substrates 135 being processed within the processing chamber 100.

A cassette 130 coupled to an actuator (not shown) is moved in and out of the internal volume 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the batch processing chamber 100 and for processing the plurality of substrates 135 in the internal volume 115.

The controller 180 includes a central processing unit (CPU) 182, a memory 184, and a support circuit 186. The CPU 182 may be any form of a general purpose computer processor that may be used in an industrial setting. The memory 184 may be a random access memory, a read-only memory, a floppy, or a hard disk drive, or other form of digital storage. The support circuit 186 is conventionally coupled to the CPU 182 and may include cache, clock circuits, input/output systems, power supplies, and the like.

The controller 180 controls the operation of various components of the batch processing chamber 100. The controller 180 controls the operation of the gas panel 150, the condenser 160, the pump 176, the inlet isolation valve 155, the outlet isolation valve 165 and the power source 145. The controller 180 is also communicatively connected to the temperature sensor 116, the pressure sensor 114, the cooling channel 124 and the temperature reading devices 156 and 162. The controller 180 receives as an input the type of processing fluid selected for the treating the substrates. Once the type of processing fluid is received by the controller 180, the controller 180 determines target pressure and temperature range which maintains the processing fluid in a gaseous state. The controller 180 uses information from the temperature sensors 116, 151, 153, 119, 167, 169 and the pressure sensor 114 to control the operation of heaters 140, 152, 154, 158, 196, 164, and 166 and the pressure provided within the internal volume 115 and fluid circuit 190. The controlled heat supplied by the heaters and pressure provided by the pressure control gas is utilized to maintain the processing fluid disposed in the fluid circuit 190 and the internal volume 115 at a temperature greater than the condensation point of the processing fluid for the applied pressure and temperature. The controller 180 uses information from the pressure sensor 114 to control the operation of the isolation valves 315, 325, 345 and 355 in the gas panel 150 to optimally supply the processing fluid into the fluid circuit 190 and maintain the processing fluid at a pressure less than the condensation pressure of the processing fluid at the applied temperature. The temperature and pressure of the internal volume 115 as well as the fluid circuit 190 are thus maintained such that the processing fluid stays in the gaseous phase.

It is contemplated that the processing fluid is selected according to the process requirements for the desired annealing of the substrates in the batch processing chamber 100. The processing fluid may comprise an oxygen-containing and/or nitrogen-containing gas, such as oxygen, steam, water, hydrogen peroxide, and/or ammonia. Alternatively or in addition to the oxygen-containing and/or nitrogen-containing gases, the processing fluid may comprise a silicon-containing gas such as but not limited to organosilicon, tetraalkyl orthosilicate gases and disiloxane gases. In some embodiments, the processing fluid may be steam or dry steam under pressure between about 5 bars and about 80 bars and the temperature may be maintained between about 150 degrees Celsius and about 250 degrees Celsius or even as much as 500 degrees Celsius. This ensures that the dry steam does not condense into water in the internal volume 115 and the fluid circuit 190, and additionally allows the dry steam to become superheated dry steam within the hot processing region 102 in which the substrates 135 are exposed to the superheated dry steam for processing.

Figure 1A:
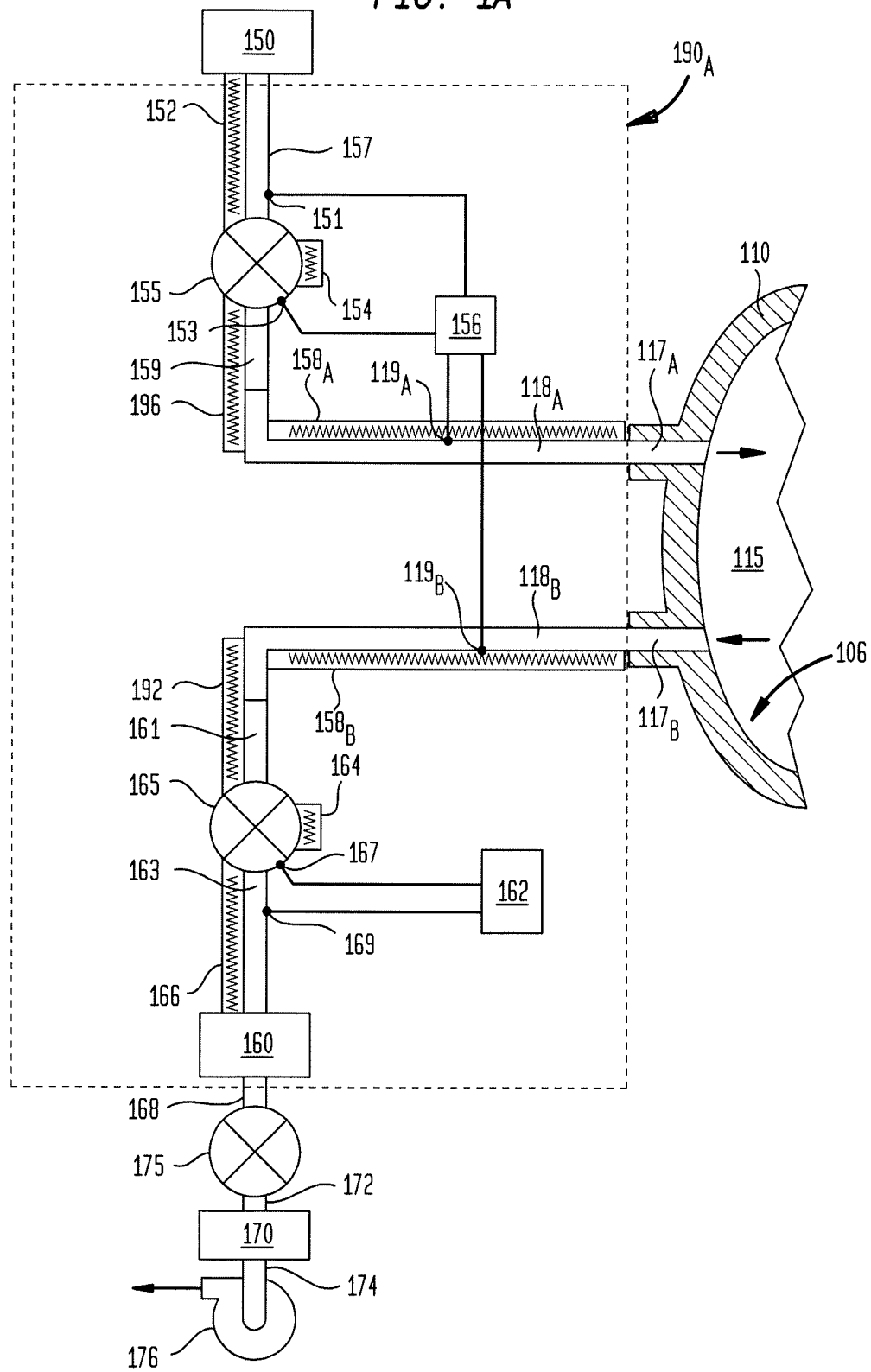
FIG. 1A is a partial cross-sectional view of a portion of a batch processing chamber illustrating connections to a temperature-controlled fluid circuit.

FIG. 1A is a partial cross-sectional view of a portion of another batch processing chamber 106 illustrating connections to a temperature-controlled fluid circuit $190_A$. The batch processing chamber 106 is essentially the same as the batch processing chamber 106 described above, except instead of a single port 117 coupling the temperature-controlled fluid circuit 190 to both the condenser 160 and gas panel 150 as shown in FIG. 1, the batch processing chamber 106 of FIG. 1A includes a first port $117_A$ coupling the internal volume 115 to the gas panel 150 of the temperature-controlled fluid circuit $190_A$, and a second port $117_B$ coupling the internal volume 115 to the condenser 160 of the temperature-controlled fluid circuit $190_A$.

The temperature-controlled fluid circuit $190_A$ essentially identical to the temperature-controlled fluid circuit 190, with the subscripts A and B denoting elements that are coupled to the gas panel side (A) and the condenser side (B). Unlike the temperature-controlled fluid circuit 190 that fluidly couples the condenser 160 and gas panel 150 within the temperature-controlled fluid circuit 190 through a common chamber conduit 118 to the internal volume 115 of the chamber body 110, the temperature-controlled fluid circuit $190_A$ fluidly isolates the condenser 160 and the gas panel 150 and separately couples the condenser 160 and the gas panel 150 through separate chamber conduits $118_{A,B}$ to the internal volume 115 of the chamber body 110 through separate dedicated ports $117_{A,B}$.

Figure 2:
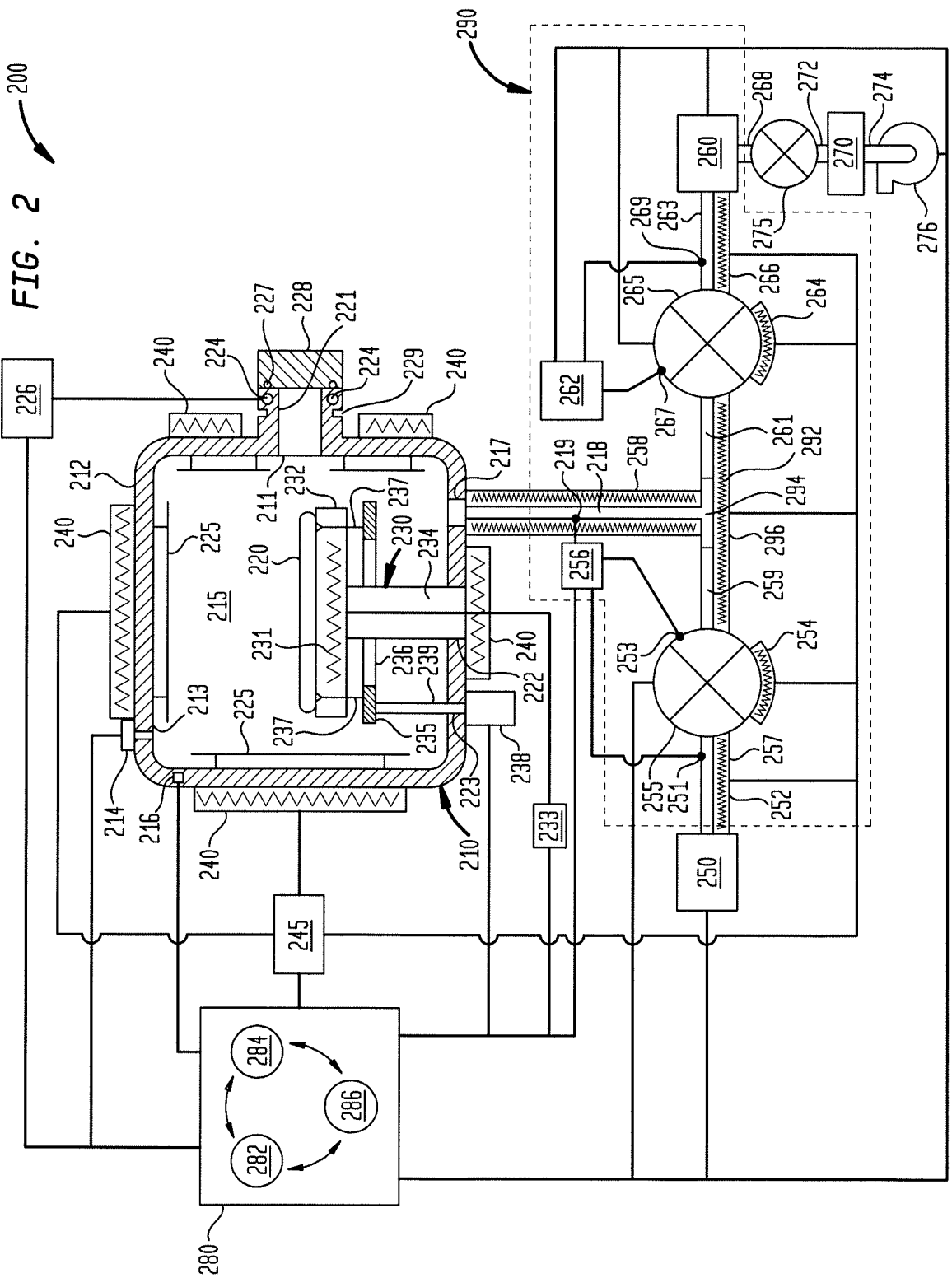
FIG. 2 is a simplified front cross-sectional view of a single-substrate processing chamber for annealing a single substrate.

FIG. 2 is a simplified front cross-sectional view of a single-substrate processing chamber 200 for a high-pressure annealing process of a single substrate at a high temperature. The single-substrate processing chamber 200 has a body 210 with an outer surface 212 and an inner surface 213 that encloses an internal volume 215. In some embodiments such as in FIG. 2, the body 210 has an annular cross section, though in other embodiments the cross-section of the body 210 may be rectangular or any closed shape. The outer surface 212 of the body 210 may be made from a corrosion resistant steel (CRS), such as but not limited to stainless steel. One or more heat shields 225 are disposed on the inner surface 213 of the body 210 that prevents heat loss from the single-substrate processing chamber 200 into the outside environment. The inner surface 213 of the body 210 as well as the heat shields 225 may be made from nickel-based steel alloys that exhibit high resistance to corrosion, such as but not limited to HASTELLOY®, ICONEL®, and MONEL®.

A substrate support 230 is disposed within the internal volume 215. The substrate support 230 has a stem 234 and a substrate-supporting member 232 held by the stem 234. The stem 234 passes through a passage 222 formed through the chamber body 210. A rod 239 connected to an actuator 238 passes through a second passage 223 formed through the chamber body 210. The rod 239 is coupled to a plate 235 having an aperture 236 accommodating the stem 234 of the substrate support 230. Lift pins 237 are connected to the substrate-supporting member 232. The actuator 238 actuates the rod 239 such that the plate 235 is moved up or down to connect and disconnect with the lift pins 237. As the lift pins 237 are raised or lowered, the substrate-supporting member 232 is raised or lowered within the internal volume 215 of the chamber 200. The substrate-supporting member 232 has a resistive heating element 231 embedded centrally within. A power source 233 is configured to electrically power the resistive heating element 231. The operation of the power source 233 as well as the actuator 238 is controlled by a controller 280.

The single-substrate processing chamber 200 has an opening 211 on the body 210 through which one or more substrates 220 can be loaded and unloaded to and from the substrate support 230 disposed in the internal volume 215. The opening 211 forms a tunnel 221 on the body 210. A slit valve 228 is configured to sealably close the tunnel 221 such that the opening 211 and the internal volume 215 can only be accessed when the slit valve 228 is open. A high-pressure seal 227 is utilized to seal the slit valve 228 to the body 210 in order to seal the internal volume 215 for processing. The high-pressure seal 227 may be made from a polymer, for example a fluoropolymer, such as but not limited to a perfluoroelastomer and polytetrafluoroethylene (PTFE). The high-pressure seal 227 may further include a spring member for biasing the seal to improve seal performance. A cooling channel 224 is disposed on the tunnel 221 adjacent to the high-pressure seals 227 in order to maintain the high-pressure seals 227 below the maximum safe-operating temperature of the high-pressure seals 227 during processing. A cooling agent from a cooling fluid source 226, such as but not limited to an inert, dielectric, and high-performance heat transfer fluid, may be circulated within the cooling channel 224. The flow of the cooling agent from the cooling fluid source 226 is controlled by the controller 280 through feedback received from a temperature sensor 216 or a flow sensor (not shown). An annular-shaped thermal choke 229 is formed around the tunnel 221 to prevent the flow of heat from the internal volume 215 through the opening 211 when the slit valve 228 is open.

The single-substrate processing chamber 200 has a port 217 through the body 210, which is fluidly connected to a fluid circuit 290 connecting the gas panel 250, the condenser 260 and the port 217. The fluid circuit 290 has substantially similar components as the fluid circuit 190 and functions in a substantially similar way as the fluid circuit 190. The fluid circuit 290 has a gas conduit 292, a source conduit 257, an inlet isolation valve 255, an exhaust conduit 263, and an outlet isolation valve 265. A number of heaters 296, 258, 252, 254, 264, 266 are interfaced with different portions of the fluid circuit 290. A number of temperature sensors 251, 253, 219, 267 and 269 are also placed at different portions of the fluid circuit 290 to take temperature measurements and send the information to the controller 280. The controller 280 uses the temperature measurement information to control the operation of the heaters 252, 254, 258, 296, 264, and 266 such that the temperature of the fluid circuit 290 is maintained at a temperature above the condensation point of the processing fluid disposed in the fluid circuit 290 and the internal volume 215.

The gas panel 250 and the pressure sensor 214 are substantially similar in nature and function as the gas panel 150 and the pressure sensor 114. The condenser 260 is substantially similar in nature and function as the condenser 160. The pump 270 is substantially similar in nature and function as the pump 176. One or more heaters 240 are disposed on the body 210 and configured to heat the internal volume 215 within the single-substrate processing chamber 200. The heaters 240 are also substantially similar in nature and function as the heaters 140 used in the batch processing chamber 100.

The controller 280 controls the operation of the single-substrate processing chamber 200. The controller 280 controls the operation of the gas panel 250, the condenser 260, the pump 270, the inlet isolation valve 255, the outlet isolation valve 265, the power sources 233 and 245. The controller 280 is also communicatively connected to the temperature sensor 216, the pressure sensor 214, the actuator 238, the cooling fluid source 226 and the temperature reading devices 256 and 262. The controller 280 is substantially similar in nature and function than the controller 180 used in the batch processing chamber 100.

The batch processing chamber 100 provides a convenient processing chamber to perform the method of annealing one or more substrates at a high temperature using a processing fluid under high pressure. The heaters 140 are powered on to heat the processing chamber 100 and maintain the internal volume 115 at a temperature above the condensation point of the processing fluid. At the same time, the heaters 152, 154, 158, 196, 164, and 166 are powered on to heat the fluid circuit 190.

A plurality of substrates 135 are loaded on the cassette 130 to be placed in the batch processing chamber 100. The door 120 of the batch processing chamber 100 is opened and the cassette 130 is moved into the internal volume 115. The door 120 is then closed to seal the substrates 135 within the processing chamber 100. A seal 122 ensure that there is no leakage from the internal volume 115 once the door 120 is closed.

A processing fluid is provided by the gas panel 150 into the internal volume 115 defined inside the processing chamber 100. The inlet isolation valve 155 is opened to allow the processing fluid to flow through the source conduit 157 and the gas conduit 192 into the internal volume 115. The outlet isolation valve 165 is kept closed at this time. The pressure at which the processing fluid is applied may be increased incrementally. The inlet isolation valve 155 is closed when a sufficient amount of processing fluid is present in the internal volume 115. Alternatively, the processing fluid may be continuously flowed through the internal volume 115 while processing the substrates 135.

During processing, the internal volume 115 as well as the fluid circuit 190 are maintained at a temperature and pressure such that the processing fluid is maintained in a gaseous phase. The temperatures of the internal volume 115 as well as the fluid circuit 190 are maintained at a temperature greater than the condensation point of the processing fluid at the applied pressure. The internal volume 115 as well as the fluid circuit 190 are maintained at a pressure less than the condensation pressure of the processing fluid at the applied temperature.

The processing is complete when the substrates 135 have achieved the desired effect through exposure to the processing fluid at the processing condition. The outlet isolation valve 165 is then opened to flow the processing fluid from the internal volume 115 through the gas conduit 192 and exhaust conduit 163 into the condenser 160. The processing fluid is condensed into a liquid phase in the condenser 160. The optional heat exchanger 170 may further cool the liquid phase processing fluid to ease in handling of the fluid. The condensed processing fluid is then removed by the pump 176. When the condensed processing fluid is removed, the outlet isolation valve 165 closes. The heaters 140, 152, 154, 158, 196, 164, and 166 maintain the processing fluid within the fluid circuit in a gaseous phase while the outlet isolation valve 165 to the condenser 160 is open to prevent condensation within the fluid circuit. The door 120 of the batch processing chamber 100 is then opened to remove the substrates 135 from the internal volume 115.

The single-substrate processing chamber 200 operates in substantially the same manner as the batch processing chamber 100. The single-substrate processing chamber 200 is used to anneal a single substrate 220 placed on the substrate support 230. The slit valve 228 is opened to load the substrate 220 through the tunnel 221 to the substrate support 230 in the internal volume 215. The heaters 252, 254, 258, 296, 264, and 266 maintain the processing fluid within the fluid circuit in a gaseous phase while delivered to the internal volume 215.

Figure 4:
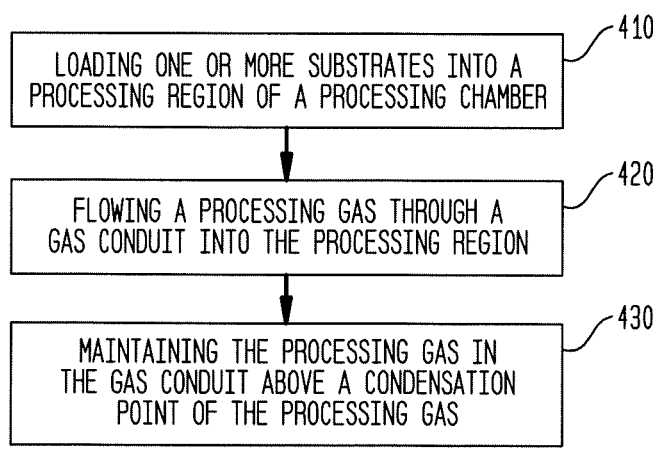
FIG. 4 is a block diagram of a method of annealing one or more substrates in a processing chamber.

FIG. 4 is a block diagram of a method 400 of annealing one or more substrates in a processing chamber, according to one embodiment of the present disclosure. The method 400 begins at block 410 by loading one or more substrates into a processing region of the processing chamber. For example, a single substrate can be loaded on a substrate support disposed in a single-substrate processing chamber. Otherwise, a plurality of substrates can be loaded on a cassette placed into a batch processing chamber.

At block 420, a processing fluid is flowed through a gas conduit into the processing region within the single-substrate processing chamber or the batch processing chamber. In some embodiments, the processing fluid may be a processing fluid under high pressure. The single substrate or the plurality of substrates is exposed to the processing fluid at a high temperature during the annealing process. After processing is complete, the processing fluid is removed from the processing region through the gas conduit and condensed by a condenser into a liquid phase. The condensed processing fluid is subsequently removed by a pump.

At block 430, the processing fluid in the gas conduit is maintained at a temperature above a condensation point of the processing fluid. The gas conduit is coupled to one or more heaters configured to maintain the processing fluid flowing through the gas conduit at a temperature above the condensation point of the processing fluid such that the processing fluid remains in a gaseous phase. In some embodiments, the heaters may comprise a resistive heating element powered by a power source. The gas conduit has one or more temperature sensors operable to measure a temperature of the gas conduit. The temperature measurements from the gas conduit are sent to a controller which uses the information to control the operation of the heaters on the gas conduit.

The type of the processing fluid selected for the treating the substrates in inputted into a user interface of the controller or by provided to the controller via another channel. The controller uses information from the temperature and pressure sensors to control the operation of heaters interfaced with different portions of the fluid circuit and the chamber body and maintain the processing fluid present in the fluid circuit and the processing region at a temperature greater than the condensation point of the processing fluid for the sensed pressure. The controller also uses information from the temperature and pressure sensors coupled to the chamber body to control the flow of processing fluid and pressure control gas from a gas panel into the fluid circuit and maintain the processing fluid at a pressure less than the condensation pressure of the processing fluid at the sensed temperature. The temperature and pressure of the processing region as well as the fluid circuit are thus maintained such that the processing fluid remains in the gaseous phase. In one example, the pressure is maintained between about 5 bars and about 35 bars while the temperature is be maintained between about 150 degrees Celsius and about 250 degrees Celsius so that processing fluid predominantly in the form steam remains in a gas phase.

The fluid circuit 190, 290 used in the processing chambers 100, 200 offers the advantage of controlling and maintaining the temperature of a processing fluid above the condensation point of the processing fluid flowing through the fluid circuit 190, 290 into a high-pressure annealing chamber. A number of heaters and temperature sensors coupled to different portions of the fluid circuit 190, 290 help the controller 180, 280 control and maintain the heat supply to the fluid circuit 190, 290 and the internal volumes 115, 215 in the processing chambers 100, 200. As a result, the condensation of the processing fluid is prevented and the processing fluid is maintained in the gaseous phase.

The batching processing chamber 100 allows a plurality of substrates to be annealed in batches at the same time under the same conditions, thus reducing the cost of processing each substrate. On the other hand, the single-substrate processing chamber 200 allows more efficient processing of the substrate, thus offering excellent substrate temperature control over each substrate to be annealed. Moreover, the single-substrate processing chamber 200 may be readily integrated with vacuum cluster processing tools, thus providing efficient substrate processing and integration of processing chambers required for device integration.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A batch processing chamber for annealing substrates under high pressure at high temperature comprising:
    a chamber body enclosing an internal volume, the internal volume configured to accommodate a plurality of substrates disposed therein;
    a gas panel configured to provide a processing fluid into the internal volume;
    a condenser fluidly connected to the internal volume, the condenser configured to condense the processing fluid into liquid phase; and
    a temperature-controlled fluid circuit configured to maintain the processing fluid at a temperature above a condensation point of the processing fluid, the temperature-controlled fluid circuit comprising:
        a gas conduit fluidly coupled to a port on the chamber body at a first end, the gas panel at a second end and the condenser at a third end;

a source conduit fluidly coupled to the gas panel at a first end and fluidly coupled to the gas conduit by an inlet isolation valve at a second end;

an exhaust conduit fluidly coupled to the condenser at a first end and fluidly coupled to the gas conduit by an outlet isolation valve at a second end; and one or more heaters coupled to each of the source conduit, the exhaust conduit, and the gas conduit, the one or more heaters configured to maintain the processing fluid flowing through the source conduit, the exhaust conduit, and the pas conduit at a temperature above a condensation point of the processing fluid flowing through the temperature-controlled fluid circuit.

2. A batch processing chamber for annealing substrates under high pressure at high temperature comprising:

a chamber body enclosing an internal volume, the internal volume configured to accommodate a plurality of substrates disposed therein;

a gas panel configured to provide a processing fluid into the internal volume;

a condenser fluidly connected to the internal volume, the condenser configured to condense the processing fluid into liquid phase;

one or more temperature sensors operable to measure a temperature of a gas conduit; and a temperature-controlled fluid circuit configured to maintain the processing fluid at a temperature above a condensation point of the processing fluid, the temperature-controlled fluid circuit comprising:

a gas conduit fluidly coupled to a port on the chamber body at a first end, the gas panel at a second end and the condenser at a third end.

3. The batching processing chamber of claim 1 further comprising:

a cooling channel disposed adjacent to a door configured to sealably close the chamber body.

4. The batch processing chamber of claim 1, wherein the chamber body is fabricated from a nickel-based superalloy.

5. A batch processing chamber for annealing substrates under high pressure at high temperature comprising:

a chamber body enclosing an internal volume, the internal volume configured to accommodate a plurality of substrates disposed therein;

a gas panel configured to provide a processing fluid into the internal volume;

a condenser fluidly connected to the internal volume, the condenser configured to condense the processing fluid into liquid phase;

an anti-convection plate disposed in the chamber body and separating the internal volume into a hot processing region in which the substrates are processed and a cooler region proximate a chamber body door; and a temperature-controlled fluid circuit configured to maintain the processing fluid at a temperature above a condensation point of the processing fluid, the temperature-controlled fluid circuit comprising:

a gas conduit fluidly coupled to a port on the chamber body at a first end, the gas panel at a second end and the condenser at a third end.

* * * * *